United States Patent
Yao

(10) Patent No.: US 7,250,813 B1
(45) Date of Patent: Jul. 31, 2007

(54) SPLIT AMPLIFIER ARCHITECTURE FOR CROSS TALK CANCELLATION

(75) Inventor: Jianguo Yao, Londonderry, NH (US)

(73) Assignee: National Semiconductor Corporation, Santa Clara, CA (US)

(*) Notice: Subject to any disclaimer, the term of this patent is extended or adjusted under 35 U.S.C. 154(b) by 102 days.

(21) Appl. No.: 11/256,033

(22) Filed: Oct. 21, 2005

(51) Int. Cl.
*H03F 1/02* (2006.01)
(52) U.S. Cl. .......................... 330/9; 327/124
(58) Field of Classification Search ............... None
See application file for complete search history.

(56) References Cited

U.S. PATENT DOCUMENTS

| | | | |
|---|---|---|---|
| 6,476,671 B1 * | 11/2002 | Tang | 330/9 |
| 6,489,850 B2 | 12/2002 | Heineke et al. | |
| 6,967,509 B2 * | 11/2005 | Rossi | 330/9 |

* cited by examiner

Primary Examiner—Khanh Van Nguyen
(74) Attorney, Agent, or Firm—Patent Law Group LLP; Carmen C. Cook

(57) ABSTRACT

An amplifier circuit includes a first amplifier and a second amplifier and sets of switching devices controlled by a bistate control signal. The bistate control signal is in the first state to cause the first and second sets of switching devices to configure the first amplifier and the second amplifier in a positive parallel configuration and the bistate control signal is in the second state to cause the first and second sets of switching devices to configure the first amplifier and the second amplifier in a negative parallel configuration. When the bistate control signal switches states at each sample cycle of the amplifier circuit, the first amplifier and the second amplifier toggle between the positive parallel configuration and the negative parallel configurations to cancel out crosstalk signals stored at the positive and negative input terminals of the first and second amplifier circuit.

21 Claims, 5 Drawing Sheets

Positive Parallel

Negative Parallel

SPLIT AMPLIFIER ARCHITECTURE FOR CROSS TALK CANCELLATION

FIELD OF THE INVENTION

The invention relates to amplifier circuits and, in particular, to an amplifier architecture for canceling cross talk.

DESCRIPTION OF THE RELATED ART

In today's analog integrated circuit (IC) design, amplifier sharing becomes a widely used technique. Amplifiers can be shared between different input channels. One example is the analog front end of an image sensor IC where the inputs generally include red, green and blue pixel information which can be processed sequentially. Thus, the red, green and blue pixel information can be processed in sequence by sharing one amplifier. Amplifiers can also be shared between different clock cycles within the same input channel. In some of the high speed low power pipelined ADC design, neighboring two stages may share one amplifier because each stage only activates its amplifier for half of the clock cycle. Amplifier sharing brings power saving and area saving.

Moreover, in a shared amplifier scheme, using the non-return-to-zero operation provides the best advantage by eliminating the reset phase between processing signals from different channels. The operation speed is doubled as compared to the return-to-zero operation. But the drawback of using the non-return-to-zero operation is signal crosstalk. Crosstalk is caused by the input capacitance of the amplifier passing signal from one cycle to the next. More specifically, when multiple signal channels share one amplifier, the finite gain of the amplifier causes a small amount of signal from one channel to be trapped on the input parasitic capacitors of the amplifier where the trapped signal is passed to the next channel, resulting in crosstalk.

First, a shared amplifier system using an ideal amplifier circuit is described. FIG. 1 is a circuit diagram of a sampled system using a shared amplifier scheme. Referring to FIG. 1, sampled system 10 is a simplified sample and hold stage with two input channels—channel one and channel two. Channel one has differential input signal pair $Vin1p$ and $Vin1n$ and channel two has differential input signal pair $Vin2p$ and $Vin2n$. Capacitors $Cs1a$ and $Cs1b$ are the sampling capacitors of channel one while capacitors $Cs2a$ and $Cs2b$ are the sampling capacitors of channel two. Capacitors $Ch1a$, $Ch1b$, $Ch2a$ and $Ch2b$ are the hold capacitors for channel one and two respectively. For the purpose of clarity, circuit details not directly relevant to the present discussion are not shown in FIG. 1. For example, it is a common knowledge that all the hold capacitors are connected in reset mode when the hold capacitors are not connected to the amplifier. The reset mode clears all signal-related charges that are stored on the hold capacitors so that the hold capacitors are ready for the next sampling cycle.

Clock signals PH1 and PH2 control the various switches in sampled system 10. Clock signals PH1 and PH2 are non-overlapping clock signals as illustrated in the insert FIG. 1A. In the present illustration, it is assumed that a switch is closed when its control signal is high. With sampled system 10 operated under clock signals PH1 and PH2, channel one and channel two are sampled and held alternately—channel two holds when channel one is sampled and channel one holds when channel two is sampled. During the sample phases, input signals charge up the respective sampling capacitors. During the hold phases, charges in the sampling capacitors are transferred to their respective holding capacitors and held by the amplifier for the following circuit to process.

The sample-and-hold operation will now be examined in detail. When clock signal PH2 is high, capacitors $Cs1a$ and $Cs1b$ are charged by input signals $Vin1p$ and $Vin1n$. Let the charges stored on capacitors $Cs1a$ and $Cs1b$ be denoted as $Qs1a$ and $Qs1b$. The charges can be quantified as:

$$Qs1a=(Vin1p-Vcmi)*Cs1a; \text{ and} \quad \text{Eq. (1)}$$

$$Qs1b=(Vin1n-Vcmi)*Cs1b, \quad \text{Eq. (2)}$$

where $Vcmi$ is the common mode voltage.

When clock signal PH1 is high, channel one enters the hold phase. Capacitors $Cs1a$ and $Cs1b$ are connected to the input terminals 12, 14 of an operational amplifier (opamp) 11 which is assumed to have ideal operational characteristics. The channel one hold capacitors $Ch1a$ and $Ch1b$ are connected in feedback loops around the opamp. Charges are transferred from the sample capacitors $Cs1a$ and $Cs1b$ to the hold capacitors $Ch1a$ and $Ch1b$. In an ideal opamp, the amplifier has infinite gain. Thus, at the end of the high phase of clock signal PH1, charges stored on capacitors $Cs1a$ and $Cs1b$ will be transferred to hold capacitors $Ch1a$ and $Ch1b$, respectively. Let voltages $Vopinp$ and $Vopinn$ denote the voltages on positive and negative input terminals 14, 12 of the opamp 11, respectively, and let charges $Qh1a$ and $Qh1b$ denote the charges stored on the hold capacitors $Ch1a$ and $Ch1b$, respectively. The output voltages of the opamp 11 are denoted as $Voutp$ at the positive output terminal 16 and $Voutn$ at the negative output terminal 18. The opamp input voltages and the hold capacitors charges can be expressed as:

$$Vopinp=Vopinn=Vcmi; \quad \text{Eq. (3)}$$

$$Qh1a=(Voutp-Vcmi)*Ch1a; \text{ and} \quad \text{Eq. (4)}$$

$$Qh1b=(Voutn-Vcmi)*Ch1b. \quad \text{Eq. (5)}$$

Between the sample and hold phase, charges are conserved. Thus, $Qh1a=Qs1a$ and $Qh1b=Qs1b$. Therefore, the output voltages can be expressed as:

$$Voutp=(Cs1a/Ch1a)*(Vin1p-Vcmi)+Vcmi, \text{ and} \quad \text{Eq. (6)}$$

$$Voutn=(Cs1b/Ch1b)*(Vin1n-Vcmi)+Vcmi \quad \text{Eq. (7)}$$

In the differential circuit of FIG. 1, the capacitance values for the two sample capacitors are the same for each channel and the capacitance values for the two hold capacitors are the same for each channel. Thus, $Cs1a=Cs1b=Cs1$ and $Ch1a=Ch1b=Ch1$. The differential output signal of the sampled system 10 when clock signal PH1 is high (channel one hold) is given as:

$$Voutp-Voutn=(Cs1/Ch1)*(Vin1p-Vin1n). \quad \text{Eq. (8)}$$

In sampled system 10, while channel one data is held by the amplifier (opamp 11) for the next stage circuit (not shown) to be processed, channel two input signals are being sampled. Channel two is sampled when clock signal PH1 is high and charges $Qs2a$ and $Qs2b$ represents the sampled charges of the channel two sample capacitors. Charges $Qs2a$ and $Qs2b$ are given as:

$$Qs2a=(Vin2p-Vcmi)*Cs2a; \text{ and} \quad \text{Eq. (9)}$$

$$Qs2b=(Vin2n-Vcmi)*Cs2b. \quad \text{Eq. (10)}$$

When clock signal PH2 becomes high, the channel one sample capacitors are disconnected from the amplifier and the channel two sample capacitors are connected to the amplifier. Charges are transferred from the channel two sample capacitors to the channel two hold capacitors. The charges on the hold capacitors are given as follows:

$$Qh2a=(Voutp-Vcmi)*Ch2a; \text{ and} \quad \text{Eq. (11)}$$

$$Qh2b=(Voutn-Vcmi)*Ch2b. \quad \text{Eq. (12)}$$

Applying charge conservation where $Qs2a=Qh2a$ and $Qs2b=Qh2b$, the output voltages during the channel two hold phase are given as:

$$Voutp=(Cs2a/Ch2a)*(Vin2p-Vcmi)+Vcmi; \text{ and} \quad \text{Eq. (13)}$$

$$Voutn=(Cs2b/Ch2b)*(Vin2n-Vcmi)+Vcmi. \quad \text{Eq. (14)}$$

Again, in the differential circuit of FIG. 1, $Cs2a=Cs2b=Cs2$ and $Ch2a=Ch2b=Ch2$. The differential output signal of the sampled system 10 when clock signal PH2 is high (channel two hold) is given as:

$$Voutp-Voutn=(Cs2/Ch2)*(Vin2p-Vin2n). \quad \text{Eq. (15)}$$

As thus operation, the operational amplifier alternately holds channel one and channel two data for the following circuit to process. Equations (8) and (15) show that, when clock signal PH1 is high, the output signal contains only channel one information and when clock signal PH2 is high, the output signal contains only channel two information. For an ideal amplifier, there is no cross talk between the two input channels.

However, in reality, the operational amplifiers all have finite gain and there is always parasitic capacitance at the input terminals of the amplifiers (for example, the gate capacitance of the input MOS transistors). FIG. 2 illustrates the sampled system of FIG. 1 with a non-ideal amplifier having finite parasitic input capacitance and finite gain. Referring to FIG. 2, sampled system 20 is configured in the same manner as sampled system 10 and like elements in both figures are given like reference numerals and will not be further described. In sampled system 20, operational amplifier (opamp) 21 is an opamp with a gain Av and parasitic input capacitance denoted by capacitors C1 and C2. In the present illustration, capacitors C1=C2=Ci where Ci is the parasitic input capacitance at input terminals 22 and 24 of opamp 21.

When referred to the DC common mode voltages, the input and output voltages of opamp 21 with gain Av have the following relationship:

$$Vopinp=-Voutn/Av, \text{ and} \quad \text{Eq. (16)}$$

$$Vopinn=-Voutp/Av. \quad \text{Eq. (17)}$$

The differential output voltage can be expressed as:

$$Vopinp-Vopinn=(Voutp-Voutn)/Av. \quad \text{Eq. (18)}$$

Because of the finite gain Av, the differential output voltage Vopinp-Vopinn does not equal to zero at the end of each hold cycle. For example, after the channel two hold switches are disconnected, there are charges trapped in capacitors C1 and C2 which can be given as:

$$Qc1 = (Vopinn - Vref)*Ci \quad \text{Eq. (19)}$$
$$= (-Voutp/Av - Vref)*Ci; \text{ and}$$

$$Qc2 = (Vopinp - Vref)*Ci \quad \text{Eq. (20)}$$
$$= (-Voutn/Av - Vref)*Ci,$$

where voltages Voutp2 and Voutn2 are channel two output signals.

The charges stored on the parasitic capacitors C1 and C2 have no where to go until clock signal PH1 becomes high. When clock signal PH1 becomes high, the amplifier 21 starts the channel one hold phase. Charge conservation applies and between the sample phase and the hold phase, the charges at nodes Vopinn and Vopinp (22, 24) are conserved. Thus, before clock signal PH1 goes high, the total charge at node Vopinn (22) are from capacitors Cs1a and C1 and is given as:

$$Qopinn=(Vcmi-Vin1p)*Cs1+Qc1. \quad \text{Eq. (21)}$$

After clock signal PH1 goes high, the total charge at node Vopinn (22) consist of charges on capacitors Cs1a, Ch1a and C1 and is given as:

$$Qopinn=(Vopinn-Vcmi)*Cs1+(Vopinn-Voutp)*Ch1+ \\ (Vopinn-Vref)*Ci. \quad \text{Eq. (22)}$$

The same analysis applies to node Vopinp (24). Before clock signal PH1 goes high, the total charge at node Vopinp (24) is given as:

$$Qopinp=(Vcmi-Vin1n)*Cs1+Qc2. \quad \text{Eq. (23)}$$

After clock signal PH1 goes high, the total charge at node Vopinp (24) is given as:

$$Qopinp=(Vopinp-Vcmi)*Cs1+(Vopinp-Voutn)*Ch1+ \\ (Vopinp-Vref)*Ci. \quad \text{Eq. (24)}$$

Applying charge conservation to equations (21)-(24) and simplifying the equations, the differential output voltage of amplifier 21 is given as:

$$Voutp-Voutn=(Cs1*(Vin1p-Vin1n)+Ci*((Voutp2- \\ Voutn2)/Av))/(Ch1+(Cs1+Ci+Ch1)/Av). \quad \text{Eq. (25)}$$

Usually Av>>1, so the term (Ch1+(Cs1+Ci+Ch1)/Av)=Ch1. The differential output voltage of equation (25) can be simplified as:

$$Voutp-Voutn=(Cs1/Ch1)*(Vin1p-Vin1n)+(Ci/Ch1)* \\ (Voutp2-Voutn2)/Av, \quad \text{Eq. (26)}$$

when clock signal PH1 is high. Similarly, when clock signal PH2 is high, the differential output voltage can be simplified as:

$$Voutp-Voutn=(Cs2/Ch2)*(Vin2p-Vin2n)+(Ci/Ch2)* \\ (Voutp1-Voutn1)/Av, \quad \text{Eq. (27)}$$

where (Voutp1-Voutn1) is the differential output voltage of amplifier 21 when clock signal PH1 is high, and (Voutp2-Voutn2) is the differential output voltage of the amplifier 21 when clock signal PH2 is high.

Equations (26) and (27) are actually nested into each other. Ignoring the higher order terms, the differential output voltages can be given as:

$$Voutp-Voutn=(Cs1/Ch1)*(Vin1p-Vin1n)+(Ci/Ch1)* \\ (Cs2/Ch2)*(Vin2p-Vin2n)/Av, \quad \text{Eq. (28)}$$

when clock signal PH1 is high. Similarly, when clock signal PH2 is high, the differential output voltage can be simplified as:

$$Voutp-Voutn=(Cs2/Ch2)*(Vin2p-Vin2n)+(Ci/Ch2)* \\ (Cs1/Ch1)*(Vin1p-Vin1n)/Av. \quad \text{Eq. (29)}$$

By comparing the equations (28) and (29) to equations (8) and (15) above, it can be observed that channel one signal also appears in channel two output and channel two signal also appears in channel one output. Due to the presence of parasitic input capacitance Ci and a finite gain Av, a small amount of signal is "leaked" from one channel to another, resulting in undesirable crosstalk.

In sum, the crosstalk observed in the shared amplifier system is caused by the parasitic input capacitance carrying the trapped charge from one channel to the next. One known solution to the crosstalk problem in shared amplifier systems is to add a 'return-to-zero' clock phase where the trapped charge is cleared between the sampling of different input channels. However, adding the return-to-zero phase is not desirable as an additional clock phase is required and the speed of the amplifier circuit is reduced by half.

An improved method to cancel or eliminate crosstalk in a shared amplifier system is therefore desired.

SUMMARY OF THE INVENTION

According to one embodiment of the present invention, an amplifier circuit having a main positive input terminal, a main negative input terminal, a main positive output terminal and a main negative output terminal includes a first amplifier, a second amplifier, a first set of switching devices and a second set of switching devices.

The first amplifier has a first positive input terminal and a first negative input terminal receiving differential input signals, and a first positive output terminal and a first negative output terminal providing differential output signals. The first amplifier has a first size.

The second amplifier has a second positive input terminal and a second negative input terminal receiving differential input signals, and a second positive output terminal and a second negative output terminal providing differential output signals. The second amplifier has a second size.

The first set of switching devices is coupled to the first and second positive input terminals and the first and second negative input terminals. The first set of switching devices is controlled by a bistate control signal having a first state and a second state.

The second set of switching devices is coupled to the first and second positive output terminals and the first and second negative output terminals. The second set of switching devices is controlled by the bistate control signal.

In operation, the bistate control signal is in the first state to cause the first and second sets of switching devices to configure the first amplifier and the second amplifier in a positive parallel configuration and the bistate control signal is in the second state to cause the first and second sets of switching devices to configure the first amplifier and the second amplifier in a negative parallel configuration. When the bistate control signal switches states at each sample cycle of the amplifier circuit, the first amplifier and the second amplifier toggle between the positive parallel configuration and the negative parallel configurations to cancel out crosstalk signals stored at the positive and negative input terminals of the first and second amplifier circuit.

According to another aspect of the present invention, a method in an amplifier circuit includes providing a first amplifier having a first size and a second amplifier having a second size where each of the first and second amplifiers has a positive and negative input terminals and a positive and negative output terminals; connecting the first amplifier and the second amplifier in a positive parallel configuration in response to a bistate control signal having a first state; connecting the first amplifier and the second amplifier in a negative parallel configuration in response to a bistate control signal having a second state; switching the state of the bistate control signal at each sample cycle of the amplifier circuit; and toggling the configuration of the first amplifier and the second amplifier between the positive parallel and the negative parallel configurations in response to the bistate control signal to cancel out crosstalk signals stored at the positive and negative input terminals of the first and second amplifier circuit.

The present invention is better understood upon consideration of the detailed description below and the accompanying drawings.

DETAILED DESCRIPTION OF THE PREFERRED EMBODIMENTS

In accordance with the principles of the present invention, an amplifier circuit is constructed using a split amplifier architecture including two amplifier half-circuits where the two amplifier half-circuits are switchably connected in a positive parallel configuration and a negative parallel configuration. In operation, the amplifier circuit switches between the positive parallel configuration and the negative parallel configuration at each sampling cycle. When applied in a shared amplifier system for sampling multiple input channels, each amplifier half circuit carries half of the crosstalk signal on its input terminals. When the amplifier circuit switches between the positive parallel and the negative parallel configurations at each sampling cycle, the crosstalk signal stored on one amplifier half circuit cancels the crosstalk signal stored on the other amplifier half circuit, thereby eliminating crosstalk between the multiple input channels. When the amplifier circuit of the present invention is applied for sampling a single input channel, the two amplifier half circuits switches between the positive parallel and negative parallel configurations to cancel noise from each sampling of the input signal, thereby improving harmonic distortion.

In one embodiment, the amplifier circuit is configured in a positive parallel configuration when the positive and negative input terminals of one amplifier half circuit are connected to the respective positive and negative input terminals of the other amplifier half circuit. The positive and negative output terminals of one amplifier half circuit are connected to the respective positive and negative output terminals of the other amplifier half circuit.

On the other hand, the amplifier circuit is configured in a negative parallel configuration when the positive/negative input and output terminals of the two amplifier half circuits are swapped. Specifically, in the negative parallel configuration, the positive input terminal of the first amplifier half circuit is connected to the negative input terminal of the second amplifier half circuit while the negative input terminal of the first amplifier half circuit is connected to the positive input terminal of the second amplifier half circuit. Similarly, the positive output terminal of the first amplifier half circuit is connected to the negative output terminal of the second amplifier half circuit while the negative output terminal of the first amplifier half circuit is connected to the positive output terminal of the second amplifier half circuit.

The amplifier circuit of the present invention is switchably connected between the positive parallel and negative parallel configurations. In one embodiment, a bi-state clock signal is used to control the switching of the amplifier circuit between the positive parallel and the negative parallel configuration at each sampling cycle.

Figures 2, 2A:
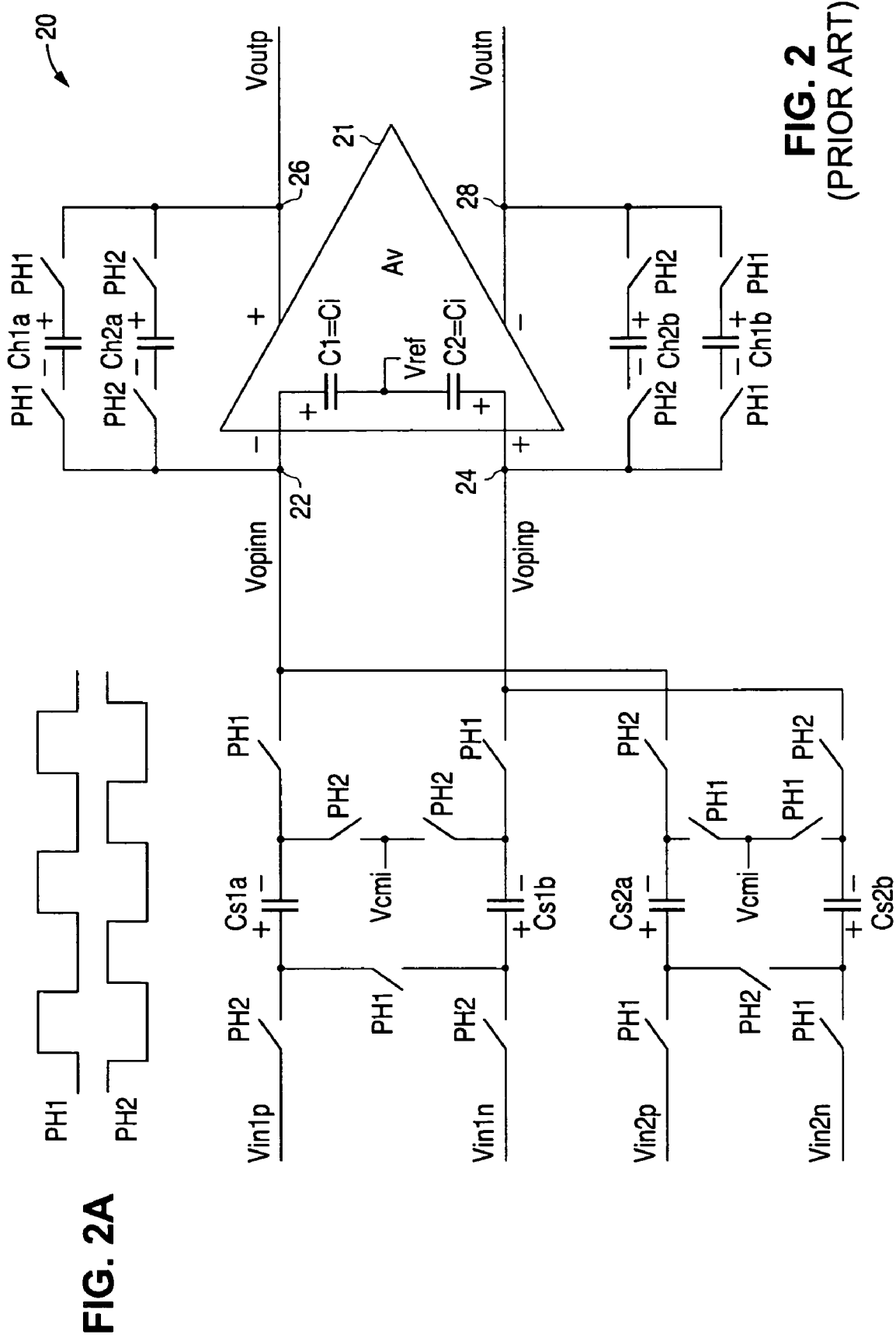
FIG. 2, including
FIG. 2A, illustrates the sampled system of FIG. 1 with a non-ideal amplifier having finite parasitic input capacitance and finite gain.
Figure 3:
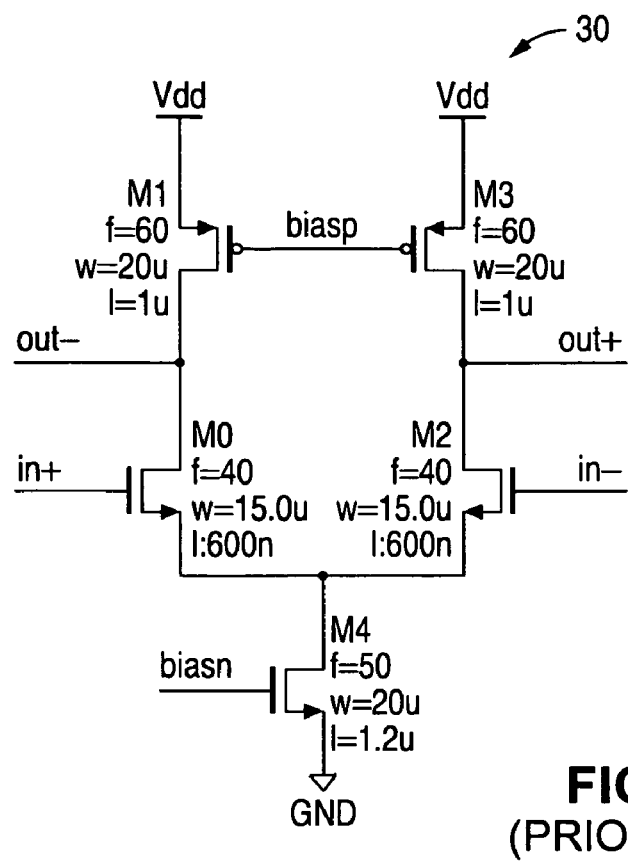
FIG. 3 illustrates the transistor-level circuit of a conventional differential amplifier.

The construction and operation of the amplifier circuit of the present invention employing the split amplifier architecture will now be described. First, reference is made to FIG. 3 which illustrates the transistor-level circuit of a conventional differential amplifier. Referring to FIG. 3, a differential amplifier 30, which can be used to implement the operational amplifier in the amplifier circuit of FIG. 2, includes a pair of input NMOS transistors M0 and M2 receiving differential input signals in+ and in−. An NMOS transistor M4 provides tail current bias while a pair of PMOS transistors M1 and M3 provides output loading. A pair of differential output signals out+ and out− is provided at the drain terminals of the input transistors M0, M2.

In analog integrated circuit designs, transistors are formed as multi-fingered devices. In other words, larger sized transistors are made of multiple smaller sized transistors connected in parallel. In differential amplifier 30 of FIG. 3, the input NMOS transistors M0 and M2 are each formed using 40 fingers (f=40) with each finger having a width/length (W/L) ratio of W/L=15μ/0.6μ. Thus, in the actual physical layout of differential amplifier 30, there are physically 40 NMOS transistors, each with a size of W=15μ and L=0.6μ, connected in parallel to make a single transistor M0 or M2. Other transistors in differential amplifier 30 are multi-fingered devices as well. For instance, transistor M4 includes 50 figures (f=50) while transistors M1 and M3 include 60 figures (f=60) each.

In accordance with the present invention, the amplifier circuit is formed using a split amplifier architecture where the amplifier circuit is split into two amplifier half circuits and the two half circuits are switchably connected in parallel in two configurations to facilitate crosstalk cancellation. Each amplifier half circuit thus has a size that equals half of the desired size of the amplifier circuit. In one embodiment, the amplifier circuit has a desired size corresponding to a certain number of fingers for each multi-fingered transistor forming the amplifier circuit and the split amplifier architecture is realized by splitting the number of fingers for each transistor in two to form two amplifier half circuits. Thus, in the present embodiment, two amplifier half circuits are formed each having half of the number of fingers for each multi-fingered transistor forming the amplifier circuit of the desired size.

Figure 4A:
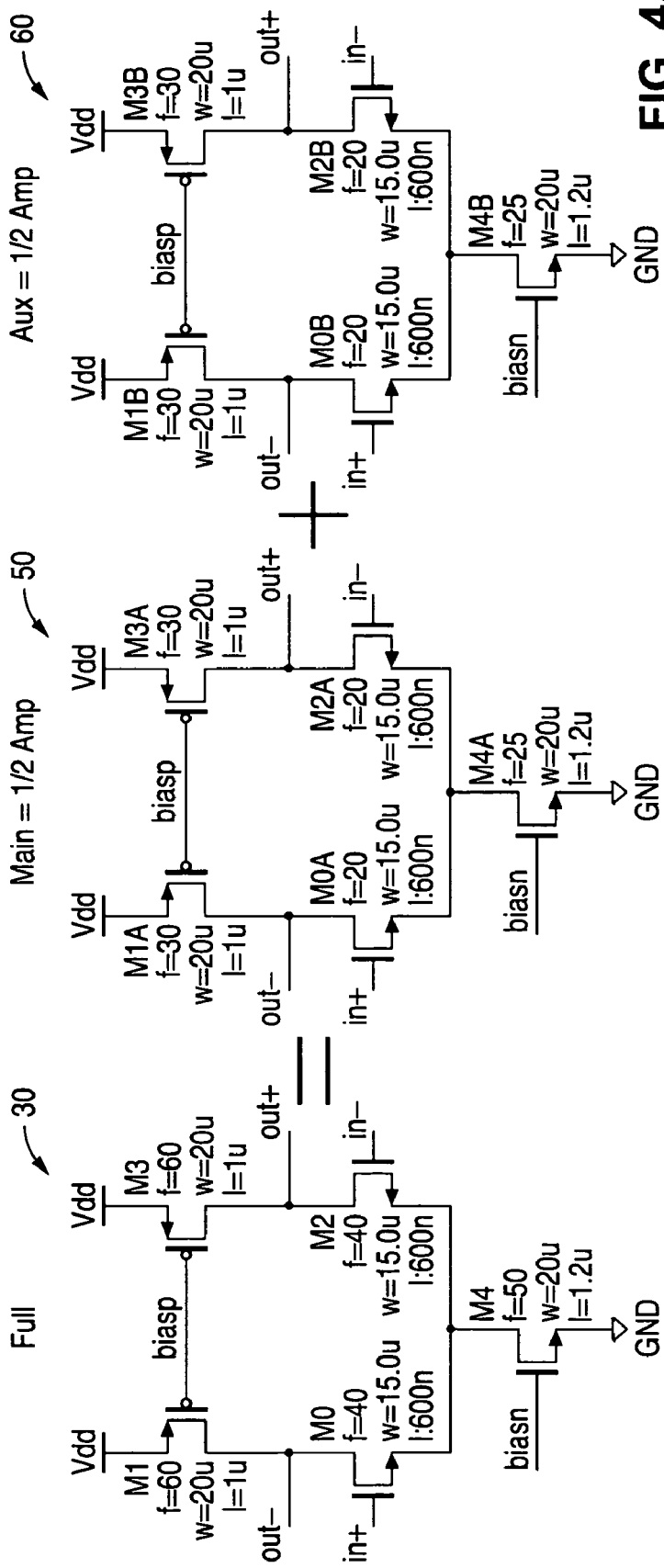
FIG. 4A is a transistor level circuit diagram of two amplifier half circuits for forming an equivalent amplifier circuit having the desired size according to one embodiment of the present invention.
Figure 4B:
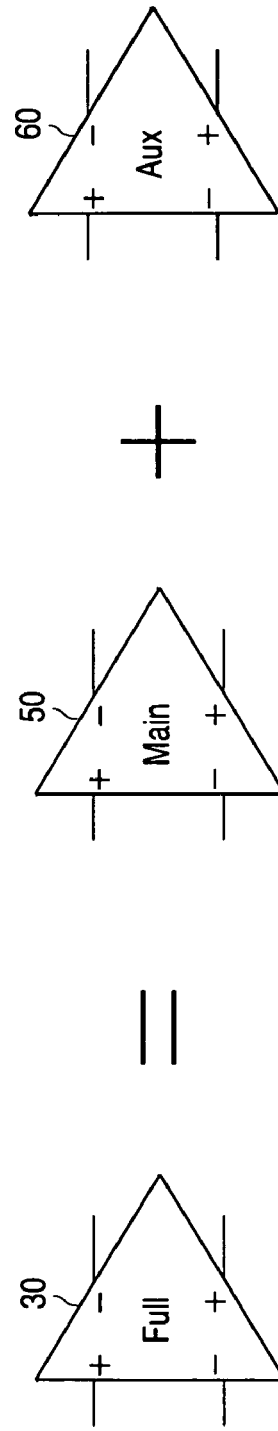
FIG. 4B illustrates the equivalent circuit representation of the amplifier half circuits of FIG. 4A.

FIG. 4A is a transistor level circuit diagram of two amplifier half circuits for forming an equivalent amplifier circuit having the desired size according to one embodiment of the present invention. FIG. 4B illustrates the equivalent circuit representation of the amplifier half circuits of FIG. 4A. Referring to FIG. 4A, "full" differential amplifier 30 represents an amplifier circuit of the desired size. For example, in differential amplifier 30, the desired size each input transistor is 40 fingers (f=40) of transistors each having a size of W/L=15μ/0.6μ. In accordance with the present invention, two amplifier half circuits 50 and 60 are used to realize the equivalent amplifier circuit 30 having the desired size. In the present description, the first amplifier half circuit 50 is referred to as the main amplifier half circuit (main amplifier) while the second amplifier half circuit 60 is referred to as the auxiliary amplifier half circuit (auxiliary amplifier).

Each of amplifier half circuits 50, 60 is formed by transistors being half the size of the corresponding transistors in amplifier 30. Thus, main amplifier half circuit 50 includes differential input NMOS transistors M0A and M2A each having 20 fingers (f=20) of transistors each having a size of W/L=15μ/0.6μ. Thus, transistor M0A is half the size of transistor M0. Other transistors (M1A, M3A and M4A) in amplifier half circuit 50 are similarly sized in half by using half the number of transistor fingers so that amplifier half circuit 50 forms one half of the amplifier circuit 30. Auxiliary amplifier half circuit 60 is formed in the same manner as main amplifier half circuit 50 so that when the main amplifier 50 and the auxiliary amplifier 60 are combined, the full amplifier circuit 30 is realized, as shown in FIG. 4B.

In the above description, the split amplifier architecture is implemented by dividing the number of transistor fingers in the amplifier of the desired size to form two amplifier half circuits. In other embodiments, other methods for dividing the desired size of the amplifier can be used to form two amplifier half circuits. The exact method of splitting the desired size of an amplifier to form two amplifier half circuits is not critical to the practice of the present invention. It is only important that two amplifier half circuits are formed which, when combined, form an amplifier circuit of the desired size, having the desired drive strength, desired gain and other electrical characteristics.

Main amplifier 50 and auxiliary amplifier 60 each includes a pair of positive and negative input terminals and a pair of positive and negative output terminals (See FIG. 4B). Main amplifier 50 and auxiliary amplifier 60 are electrically identical and operate in the same manner to receive differential input signals and generate differential output signals. Because of the symmetry of the differential amplifier circuit, the combined amplifier circuit of main amplifier 50 and auxiliary amplifier 60 has the same drive capability, power consumption and frequency response as a "full" differential amplifier having the combined size. Being half the size of the combined amplifier circuit, each amplifier half circuit consumes half the power and provides half of the parasitic input capacitance of the combined circuit.

Figure 5:
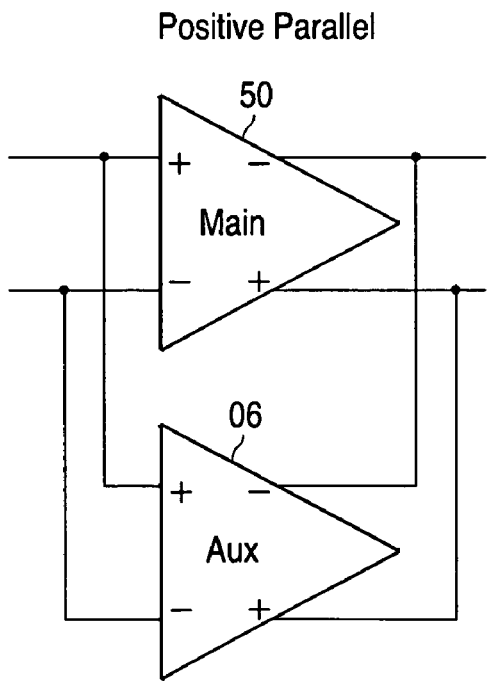
FIG. 5 illustrates a first way to connect the main amplifier and the auxiliary amplifier to form an amplifier circuit, referred herein as the positive parallel configuration.

As thus constructed, main amplifier 50 and auxiliary amplifier 60 form fully differential amplifier and the two differential input signals and the two differential output signals are completely symmetrical. Thus, in each amplifier, the positive output terminal can be used as the negative output terminal as long as the input terminals are swapped accordingly. Because of the input/output symmetry, there are two ways to connected main amplifier 50 and auxiliary amplifier 60 in parallel to form the combined amplifier circuit. FIG. 5 illustrates a first way to connect main amplifier 50 and auxiliary amplifier 60 to form an amplifier circuit, referred herein as the positive parallel configuration, and FIG. 6 illustrates a second way to connect main amplifier 50 and auxiliary amplifier 60 to form an amplifier circuit, referred herein as the negative parallel configuration.

Referring to FIG. 5, in the positive parallel configuration, the positive input terminal of main amplifier half circuit 50 is connected to the positive input terminal of auxiliary amplifier half circuit 60 while the negative input terminal of main amplifier 50 is connected to the negative input terminal of main amplifier 60. The positive and negative output terminals of main amplifier half circuit 50 are also connected to the respective positive and negative output terminals of auxiliary amplifier half circuit 60, as shown in FIG. 5.

Figure 6:
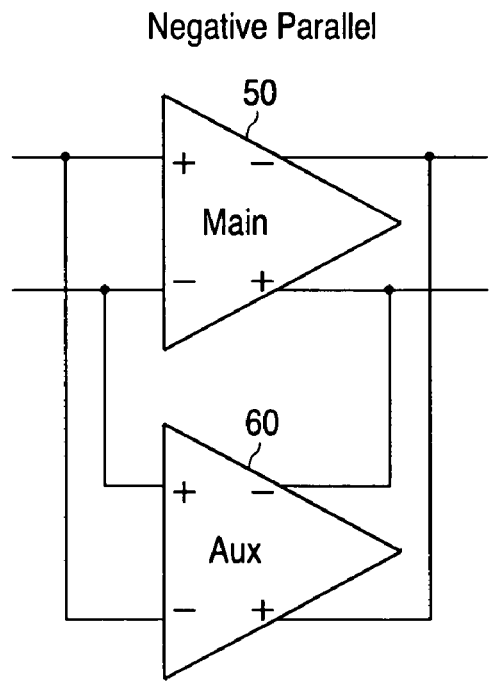
FIG. 6 illustrates a second way to connect the main amplifier and the auxiliary amplifier to form an amplifier circuit, referred herein as the negative parallel configuration.

In the negative parallel configuration, the positive/negative input and output terminals of the two amplifier half circuits are swapped, as shown in FIG. 6. Thus, the positive input terminal of main amplifier half circuit 50 is connected to the negative input terminal of auxiliary amplifier half circuit 60 while the negative input terminal of main amplifier half circuit 50 is connected to the positive input terminal of auxiliary amplifier half circuit 60. Meanwhile, the positive output terminal of main amplifier half circuit 50 is connected to the negative output terminal of auxiliary amplifier half circuit 60 while the negative output terminal of main amplifier half circuit 50 is connected to the positive output terminal of auxiliary amplifier half circuit 60.

The positive parallel and negative parallel configurations of the main and auxiliary amplifiers are electrically identical. Thus, the two configurations can be used interchangeably to process input signals to provide the identical output signals. In accordance with the present invention, the amplifier circuit uses the positive parallel and negative parallel configurations advantageously to cancel out crosstalk signals at the input of the amplifier circuit.

Figures 1, 1A:
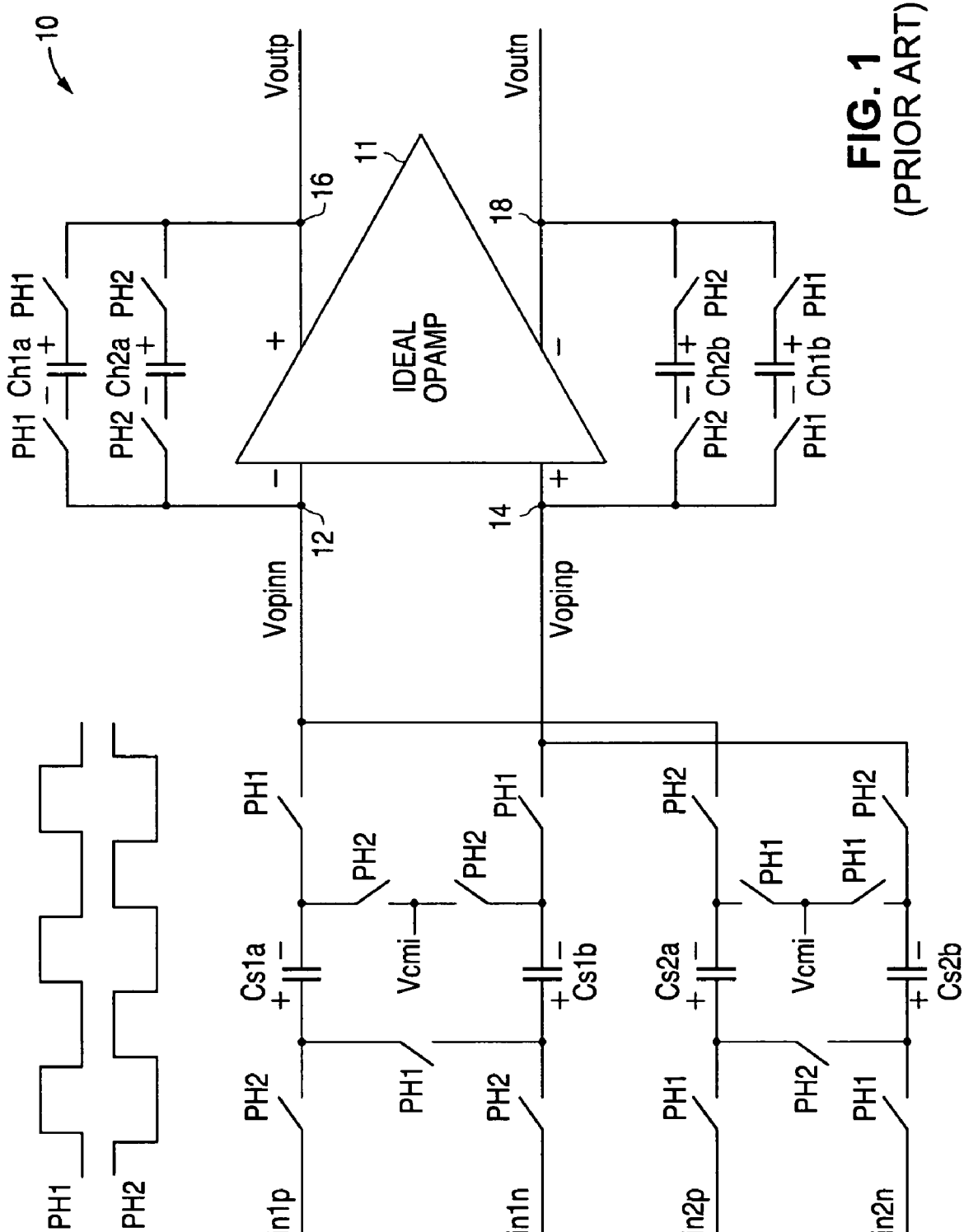
FIG. 1, including
FIG. 1A, is a circuit diagram of a sampled system using a shared amplifier scheme.
Figure 7:
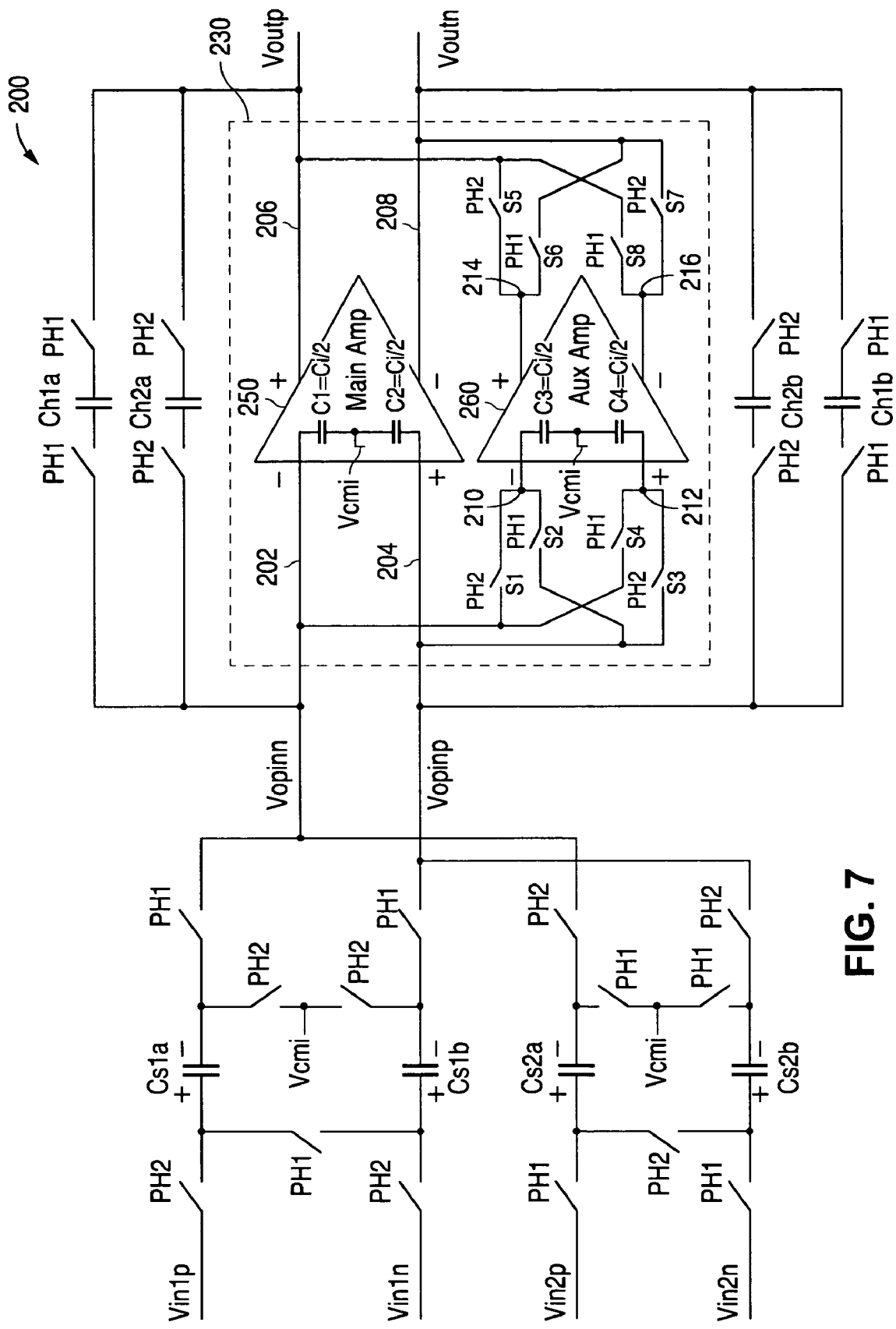
FIG. 7 is a circuit diagram of a sampled system using a shared amplifier scheme incorporating the amplifier circuit according to one embodiment of the present invention.

FIG. 7 is a circuit diagram of a sampled system using a shared amplifier scheme incorporating the amplifier circuit according to one embodiment of the present invention. Referring to FIG. 7, sampled system 200 is a sample and hold stage for sampling two input channels and is configured in the same manner as sampled system 10 of FIG. 1. Like elements between FIGS. 1 and 7 are given like reference numerals and will not be further described. In the present embodiment, sampled system 200 incorporates an amplifier circuit 230 implementing the split amplifier architecture in accordance with the present invention to effectively cancel out crosstalk between the two input channels. Amplifier circuit 230 includes a negative input terminal (node 202) receiving input voltage Vopinn and a positive input terminal (node 204) receiving input voltage Vopinp. Amplifier circuit 230 also has a positive output terminal (node 206) providing output voltage Voutp and a negative output terminal (node 208) providing output voltage Voutn.

As shown in FIG. 7, amplifier circuit 230 includes a main amplifier 250 and an auxiliary amplifier 260. Main and auxiliary amplifiers 250, 260 are the same size and are each half the combined size of amplifier circuit 230. Assuming that Ci denotes the parasitic input capacitance of amplifier circuit 230 having the combined size. Then, each input terminal of an amplifier half circuit will have a parasitic capacitance being one half of capacitance Ci. In FIG. 7, the parasitic input capacitance at the negative input terminal (node 202) and the positive input terminal (node 204) of main amplifier 250 are denoted by capacitors C1 and C2, each having a capacitance value of Ci/2. Also, the parasitic input capacitance at the negative input terminal (node 210) and the positive input terminal (node 212) of auxiliary amplifier 260 are denoted by capacitors C3 and C4, each having a capacitance value of Ci/2.

To facilitate crosstalk cancellation, amplifier circuit 230 operates in a bistate mode and at each sample cycle, main amplifier 250 and auxiliary amplifier 260 are alternately connected in the positive parallel and in the negative parallel configurations as shown in FIGS. 5 and 6. In the present embodiment, switches S1 to S8, coupled to the positive and negative, input and output terminals of amplifiers 250, 260 (nodes 202, 204, 206, 208, 210, 212, 214 and 216) are used to connect main amplifier 250 and auxiliary amplifier 260 alternately in the positive parallel configuration and the negative parallel configuration at each sample cycle.

Switches S1 to S8 are control by a pair of switch control signals. The switch control signals only need to be a bi-state clock signal that switches every sample cycle. In the present embodiment, clock signal PH1 and clock signal PH2, as shown in FIG. 1A, are used as the switch control signals. Thus, when clock signal PH2 is high, switches S1, S3, S5 and S7 are closed to connect main amplifier 250 and auxiliary amplifier 260 in the positive parallel configuration. When clock signal PH1 is high, switches S2, S4, S6 and S8 are closed to connect main amplifier 250 and auxiliary amplifier 260 in the negative parallel configuration. As discussed above, because of the symmetry of the differential amplifier, the combined amplifier circuit 230 is electrically identical in either of the configurations in terms of driving capability, power consumption and frequency response.

In the present embodiment, switches S1 to S8 are implemented using MOS transistors. Each of switches S1 to S8 can be implemented using an NMOS transistor or a PMOS transistor or the switch can be implemented as a CMOS transmission gate. Other switching devices can also be used to implement switches S1 to S8.

As described above, the input capacitance of operational amplifier of the sampled system carry charges related to one cycle to the next to cause undesirable crosstalk. Crosstalk is small signal in nature. When referenced to the input common mode voltage Vcmi, the crosstalk can be characterized as having one of the opamp input capacitance (e.g. associated with the positive input terminal) carrying a positive crosstalk charge (Qx) and the other input capacitance (e.g. associated with the negative input terminal) carrying a negative crosstalk charge (−Qx). The positive and negative crosstalk charges are centered about the input common mode voltage Vcmi of the opamp.

When the opamp is configured as amplifier circuit 230 implementing a split amplifier architecture including main amplifier 250 and auxiliary amplifier 260, each of main amplifier 250 and auxiliary amplifier 260 carries half of the crosstalk charges. In accordance with the present invention, when amplifier circuit 230 toggles between the positive parallel configuration and the negative parallel configuration at each sample cycle, the crosstalk charges stored at the input capacitance of main amplifier 250 and the input capacitance of auxiliary amplifier 260 will cancel each other out, thereby eliminating crosstalk entirely from the system.

More specifically, when clock signal PH2 is high, main amplifier 250 and auxiliary amplifier 260 are in the positive parallel configuration. Parasitic input capacitance represented by capacitors C1 and C3 will each has a charge of Qx/2 trapped in them. Meanwhile, parasitic input capacitance represented by capacitors C2 and C4 will each has a charge of −Qx/2 trapped in them. When clock signal PH1 becomes high, switches S1 to S8 causes main amplifier 250 and auxiliary amplifier 260 to toggle to the negative parallel configuration. Charges stored in capacitors C4 and C1 are added together at node Vopinn (node 202) to cancel each other. Similarly, charges stored in capacitors C2 and C3 are added together at node Vopinp (node 204) to cancel each other out. In this manner, charges that are trapped at the input capacitances of amplifier circuit 230 cancel each other out at each sample cycle and no trapped charges from one sample cycle are leaked to another sample cycle.

At the end of the channel one hold phase (i.e., end of clock signal PH1 being high), capacitors C1 and C4 are charged with a crosstalk charge of Qx/2 and capacitors C2 and C3 are charged with a crosstalk charge of −Qx/2. When clock signal PH2 becomes high, main amplifier 250 and auxiliary amplifier 260 toggles back to the positive parallel configuration. Charges stored in capacitors C1 and C3 are added to node Vopinn (node 202) while charges in capacitors C2 and C4 are added to node Vopinp (node 204). Again, when amplifier circuit 230 toggles from the negative parallel configuration to the positive parallel configuration, the charges stored on capacitors C1 to C4 cancel each other out, leaving no signal from one sample cycle leaking to another sample cycle. In this manner, crosstalk is completely eliminated.

Thus, by employing an amplifier circuit constructed using a split amplifier architecture in accordance with the present invention, effective crosstalk cancellation can be achieved. Thus, the amplifier circuit of the present invention can be applied in a shared amplifier system to allow multiple input channels to be processed without signal corruption due to crosstalk between the input channels. When the amplifier circuit of the present invention is applied in a single channel system, the split amplifier architecture operates to cancel noise and charges stored on the parasitic input capacitance of the amplifier at each sampling cycle so that harmonic distortion of the sampled input signal is greatly reduced.

The split amplifier architecture of the present invention is simple to implement and does not increase the power consumption of the amplifier circuit. The amplifier circuit only needs to be controlled by a simple bistate clocking scheme so that the amplifier circuit toggles between the positive parallel configuration and the negative parallel configuration at each sample cycle. In the present description, a bistate clocking scheme refers to a clock signal that switches between a first state (e.g. logical 'hi') and a second state (e.g. logical 'lo') at each sample cycle of the amplifier circuit. In general, the bistate clocking scheme includes a bistate clock signal and its inverse. In a preferred embodiment, the bistate clocking scheme includes a first clock signal switching state at each sample cycle and a second clock signal being an inverse of the first clock signal and being non-overlapping with the first clock signal.

In the embodiment shown in FIG. 7, the amplifier circuit of the present invention is applied to a shared amplifier system including two input channels. The amplifier circuit of the present invention can in fact be applied in a shared amplifier system including n input channels. In an n-input channel system, a set of n-phase clock signals is used to sample the n input channels. The amplifier circuit of the present invention only requires a bistate clock to allow the amplifier circuit to toggle between the positive parallel and the negative parallel configurations at each sample cycle. Crosstalk cancellation can be effectuated as long as the amplifier circuit toggles between the two configurations whenever new data is sampled. In one embodiment, the n-phase clock signals are logically "OR" together and coupled to a flip-flop to generate the bistate clock.

In the above description, the amplifier circuit is described as having a "desired size" while each of the main amplifier and the auxiliary amplifier circuit are described to have half of the desired size. In the present description, the "size" of an amplifier refers collectively to the sizes of transistors used to form the amplifier. Thus, the desired size of the amplifier circuit refers to the sizes of transistors used to form the amplifier circuit to provide the desired gain (Av) or other desired electrical characteristics of the amplifier circuit. The "size" of the main amplifier and the auxiliary amplifier refers to the sizes of the transistors used to form the main and auxiliary amplifiers. It is understood that an amplifier includes input transistors, loading transistors and tail current bias transistor, and the transistors in an amplifier may not be all of the same size. Therefore, the term "size of an amplifier" refers collectively to the sizes of the transistors in an amplifier where the size of each transistor may not be the same. However, when the main and auxiliary amplifiers each has half the size of the amplifier circuit, the transistors in each of the main and auxiliary amplifiers each has half the size of the corresponding transistor of the amplifier circuit.

The above detailed descriptions are provided to illustrate specific embodiments of the present invention and are not intended to be limiting. Numerous modifications and variations within the scope of the present invention are possible. For example, in the above descriptions, the main and auxiliary amplifiers have been described above as having the same size. That is, the transistors in the main amplifier have the same size as the corresponding transistors in the auxiliary amplifier. However, in other embodiments, it is possible to use a main amplifier and an auxiliary amplifier having different sizes. That is, the transistors in the main amplifier may have different sizes as the corresponding transistors in the auxiliary amplifier. In that case, although complete crosstalk cancellation is not achieved, partial crosstalk cancellation can be realized. The present invention is defined by the appended claims.

I claim:

1. An amplifier circuit having a main positive input terminal, a main negative input terminal, a main positive output terminal and a main negative output terminal, the amplifier circuit comprising:
   a first amplifier having a first positive input terminal and a first negative input terminal receiving differential input signals, and a first positive output terminal and a first negative output terminal providing differential output signals, the first amplifier having a first size;
   a second amplifier having a second positive input terminal and a second negative input terminal receiving differential input signals, and a second positive output terminal and a second negative output terminal providing differential output signals, the second amplifier having a second size;
   a first plurality of switching devices coupled to the first and second positive input terminals and the first and second negative input terminals, the first plurality of switching devices being controlled by a bistate control signal having a first state and a second state; and
   a second plurality of switching devices coupled to the first and second positive output terminals and the first and second negative output terminals, the second plurality of switching devices being controlled by the bistate control signal,
   wherein the bistate control signal is in the first state to cause the first and second pluralities of switching devices to configure the first amplifier and the second amplifier in a positive parallel configuration and the bistate control signal is in the second state to cause the first and second pluralities of switching devices to configure the first amplifier and the second amplifier in a negative parallel configuration, and when the bistate control signal switches states at each sample cycle of the amplifier circuit, the first amplifier and the second amplifier toggle between the positive parallel configuration and the negative parallel configurations to cancel out crosstalk signals stored at the positive and negative input terminals of the first and second amplifier circuit.

2. The amplifier circuit of claim 1, wherein when the bistate control signal is in the first state, the first plurality of switching devices connects the first positive input terminal to the second positive input terminal to form the main positive input terminal and the first negative input terminal to the second negative input terminal to form the main negative input terminal, and the second plurality of switching devices connects the first positive output terminal to the second positive output terminal to form the main positive output terminal and the first negative output terminal to the second negative output terminal to form the main negative output terminal, thereby forming the positive parallel configuration.

3. The amplifier circuit of claim 1, wherein when the bistate control signal is in the second state, the first plurality of switching devices connects the first positive input terminal to the second negative input terminal to form the main positive input terminal and the first negative input terminal to the second positive input terminal to form the main negative input terminal, and the second plurality of switching devices connects the first positive output terminal to the second negative output terminal to form the main positive output terminal and the first negative output terminal to the second positive output terminal to form the main negative output terminal, thereby forming the negative parallel configuration.

4. The amplifier circuit of claim 1, wherein the first size is the same as the second size and the first positive and negative input terminals of the first amplifier and the second positive and negative input terminals of the second amplifier have the same parasitic input capacitance.

5. The amplifier circuit of claim 4, wherein the first amplifier and the second amplifier each comprises a differential amplifier including a pair of input transistors, the gate terminals of the pair input transistor forming the respective positive and negative input terminals of the respective first or second amplifier, the gate capacitance of the input transistor contributing to the parasitic input capacitance at the positive and negative input terminals of each of the first and second amplifiers.

6. The amplifier circuit of claim 1, wherein the first amplifier and the second amplifier each comprises a differential amplifier, the differential amplifier comprising a pair of input transistors, a bias transistor and a pair of loading transistors, and the first size of the first amplifier and the second size of the second amplifier refer collectively to the sizes of the input transistors, the bias transistor and the loading transistors in the respective differential amplifier.

7. The amplifier circuit of claim 6, wherein in each of the first and second amplifiers, the sizes of the input transistors, the bias transistor and the loading transistors are not the same.

8. The amplifier circuit of claim 6, wherein the transistor sizes of the input transistors, the bias transistor and the loading transistors in the first amplifier are the same as the transistor sizes for the corresponding transistors in the second amplifier.

9. The amplifier circuit of claim 6, wherein the transistor sizes of the input transistors, the bias transistor and the loading transistors in the first amplifier are not the same as the transistor sizes for the corresponding transistors in the second amplifier.

10. The amplifier circuit of claim 1, wherein the bistate control signal comprises a first clock signal switching between the first state and the second state at each sample cycle of the amplifier circuit and a second clock signal being an inverse of the first clock signal.

11. The amplifier circuit of claim 10, wherein the first clock signal and the second clock signal are non-overlapping clock signals.

12. The amplifier circuit of claim 1, wherein the main positive and negative input terminals of the amplifier circuit are switchably coupled to sample a plurality of input channels, the first and second amplifiers toggle between the positive parallel configuration and the negative parallel configuration at each sample cycle of the input channels to cancel out crosstalk signals between the input channels.

13. The amplifier circuit of claim 1, wherein the main positive and negative input terminals of the amplifier circuit are switchably coupled to sample a single input channel, the first and second amplifiers toggle between the positive parallel configuration and the negative parallel configuration at each sample cycle of the input channels to cancel out crosstalk signals between sampling of the single input channel.

14. The amplifier circuit of claim 10, wherein the first plurality of switching devices comprises:
    a first switch coupled between the first negative input terminal and the second negative input terminal, the first switch being controlled by the first clock signal;
    a second switch coupled between the first positive input terminal and the second negative input terminal, the second switch being controlled by the second clock signal;
    a third switch coupled between the first positive input terminal and the second positive input terminal, the third switch being controlled by the first clock signal; and
    a fourth switch coupled between the first negative input terminal and the second positive input terminal, the fourth switch being controlled by the second clock signal.

15. The amplifier circuit of claim 10, wherein the second plurality of switching devices comprises:
    a fifth switch coupled between the first positive output terminal and the second positive output terminal, the fifth switch being controlled by the first clock signal;
    a sixth switch coupled between the first negative output terminal and the second positive output terminal, the sixth switch being controlled by the second clock signal;
    a seventh switch coupled between the first negative output terminal and the second negative output terminal, the seventh switch being controlled by the first clock signal; and
    an eighth switch coupled between the first positive output terminal and the second negative output terminal, the eighth switch being controlled by the second clock signal.

16. A method in an amplifier circuit comprising:
    providing a first amplifier of a first size and a second amplifier of a second size, each of the first and second amplifiers having a positive and negative input terminals and a positive and negative output terminals;
    connecting the first amplifier and the second amplifier in a positive parallel configuration in response to a bistate control signal having a first state;

connecting the first amplifier and the second amplifier in a negative parallel configuration in response to a bistate control signal having a second state;

switching the state of the bistate control signal at each sample cycle of the amplifier circuit; and toggling the configuration of the first amplifier and the second amplifier between the positive parallel and the negative parallel configurations in response to the bistate control signal to cancel out crosstalk signals stored at the positive and negative input terminals of the first and second amplifier circuit.

17. The method of claim 16, wherein the first size is the same as the second size and the first amplifier and the second amplifier have the same parasitic input capacitance.

18. The method of claim 16, wherein connecting the first amplifier and the second amplifier in the positive parallel configuration in response to the bistate control signal having the first state comprises:

connecting the positive input terminal of the first amplifier to the positive input terminal of the second amplifier;

connecting the negative input terminal of the first amplifier to the negative input terminal of the second amplifier;

connecting the positive output terminal of the first amplifier to the positive output terminal of the second amplifier; and connecting the negative output terminal of the first amplifier to the negative output terminal of the second amplifier.

19. The method of claim 16, wherein connecting the first amplifier and the second amplifier in the negative parallel configuration in response to the bistate control signal having the second state comprises:

connecting the positive input terminal of the first amplifier to the negative input terminal of the second amplifier;

connecting the negative input terminal of the first amplifier to the positive input terminal of the second amplifier;

connecting the positive output terminal of the first amplifier to the negative output terminal of the second amplifier; and connecting the negative output terminal of the first amplifier to the positive output terminal of the second amplifier.

20. The method of claim 16, wherein the amplifier circuit is disposed to sample a plurality of input channels, the first and second amplifiers toggle between the positive parallel configuration and the negative parallel configuration at each sample cycle of the input channels to cancel out crosstalk signals between the input channels.

21. The method of claim 16, wherein the amplifier circuit is disposed to sample a single input channel, the first and second amplifiers toggle between the positive parallel configuration and the negative parallel configuration at each sample cycle of the input channels to cancel out crosstalk signals between sampling of the single input channel.

\* \* \* \* \*